(12) United States Patent
Flores et al.

(10) Patent No.: US 10,756,048 B2
(45) Date of Patent: Aug. 25, 2020

(54) METHODS FOR IMPROVED DIE BONDING

(71) Applicant: SKYWORKS SOLUTIONS, INC., Woburn, MA (US)

(72) Inventors: José Manuel Flores, Mexicali (MX); Rogelio Eduardo Estrada, Mexicali (MX); Daniel Orozco Mariscal, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/267,396

(22) Filed: Feb. 5, 2019

(65) Prior Publication Data

US 2020/0006283 A1 Jan. 2, 2020

Related U.S. Application Data

(62) Division of application No. 15/394,609, filed on Dec. 29, 2016, now Pat. No. 10,199,351.

(60) Provisional application No. 62/272,914, filed on Dec. 30, 2015.

(51) Int. Cl.
*H01L 23/00* (2006.01)

(52) U.S. Cl.
CPC .............. *H01L 24/83* (2013.01); *H01L 24/75* (2013.01); *H01L 24/29* (2013.01); *H01L 2224/2919* (2013.01); *H01L 2224/759* (2013.01); *H01L 2224/75251* (2013.01); *H01L 2224/75253* (2013.01); *H01L 2224/75901* (2013.01); *H01L 2224/83037* (2013.01); *H01L 2224/8385* (2013.01); *H01L 2224/83095* (2013.01); *H01L 2224/83099* (2013.01); *H01L 2224/83862* (2013.01); *H01L 2224/83908* (2013.01); *H01L 2924/14* (2013.01)

(58) Field of Classification Search
CPC ....... H01L 24/29; H01L 24/743; H01L 24/75; H01L 24/83; H01L 2224/2919; H01L 2224/2969; H01L 2224/743; H01L 2224/75251; H01L 2224/75253; H01L 2224/7526; H01L 2224/759; H01L 2224/75901; H01L 2224/83037; H01L 2224/83095; H01L 2224/83099; H01L 2224/8385; H01L 2224/83862; H01L 2224/83908

See application file for complete search history.

(56) References Cited

U.S. PATENT DOCUMENTS

| | | | |
|---|---|---|---|
| 6,193,136 B1 * | 2/2001 | Higashi | B23K 20/10 228/106 |
| 8,450,150 B2 * | 5/2013 | Maki | H01L 21/6836 257/686 |
| 2007/0196952 A1 * | 8/2007 | Yoshimura | H01L 21/6838 438/108 |

(Continued)

FOREIGN PATENT DOCUMENTS

JP 10022344 A * 1/1998 ............. H01L 24/27

*Primary Examiner* — Stephen W Smoot
(74) *Attorney, Agent, or Firm* — Chang & Hale LLP

(57) ABSTRACT

Methods for improved die bonding. In some embodiments, a method includes applying hot air to a die. The method also includes placing the die on a substrate after applying the hot air to the die. The method further includes waiting a predefined bonding period in order to establish a bond between the die and the substrate.

17 Claims, 5 Drawing Sheets

(56) References Cited

U.S. PATENT DOCUMENTS

| | | | |
|---|---|---|---|
| 2010/0193968 A1* | 8/2010 | Takamoto | H01L 21/6836 257/778 |
| 2012/0248598 A1* | 10/2012 | Sueoka | B23K 3/0471 257/737 |
| 2013/0095608 A1 | 4/2013 | Chen et al. | |
| 2015/0122414 A1 | 5/2015 | Phillips | |
| 2017/0129031 A1 | 5/2017 | Greve et al. | |

* cited by examiner

METHODS FOR IMPROVED DIE BONDING

CROSS-REFERENCE TO RELATED APPLICATION(S)

This application is a divisional of U.S. patent application Ser. No. 15/394,609, filed Dec. 29, 2016, entitled "METHOD AND DEVICE FOR IMPROVED DIE BONDING," now U.S. Pat. No. 10,199,351, issued Feb. 5, 2019, which claims priority to U.S. Provisional Patent Application No. 62/272,914, filed Dec. 30, 2015, entitled "METHOD AND DEVICE FOR IMPROVED DIE BONDING." The contents of each of the above-referenced application(s) are hereby expressly incorporated by reference herein in their entireties for all purposes.

BACKGROUND

Field

The present disclosure relates to systems and methods of manufacturing chips or integrated circuits (ICs).

Description of Related Art

During a manufacturing process, chips and/or integrated circuits (ICs), semiconductor die are often bonded to a substrate or package with an adhesive material. Bonding the chips and/or integrate circuits to a substrate/package with an adhesive material may be referred to herein as a "die bonding process."

SUMMARY

In some implementations, the present disclosure relates to a bonding device comprising. The bonding device includes a heating element configured to heat air. The bonding device also includes an application element having a plurality of holes configured to apply the heated air to a die, the application element is characterized by an arrangement of the plurality of holes that satisfies one or more directionality criteria. The bonding device further includes a controller configured to control the heating element and to set the temperature of the heated air expelled through the plurality of holes of the application element in order to satisfy one or more bonding criteria.

In some embodiments, the bonding device further includes an air blower configured to expel the heated air through the plurality of holes of the application element.

In some embodiments, the controller is configured to control the air blower and to set the pressure of the heated air expelled through the plurality of holes of the application element in order to satisfy the one or more bonding criteria.

In some embodiments, the controller is configured to control the air blower and to set the velocity of the heated air expelled through the plurality of holes of the application element in order to satisfy the one or more bonding criteria.

In some embodiments, the application element includes a temperature sensor that provides the temperature of the heated air expelled through the plurality of holes of the application element to satisfy the one or more bonding criteria.

In some embodiments, the application element includes a pressure sensor that provides the pressure of the heated air expelled through the plurality of holes of the application element to the controller.

In some embodiments, the application element includes a velocity sensor that provides the velocity of the heated air expelled through the plurality of holes of the application element to the controller.

In some embodiments, the one or more directionality criteria are satisfied when the angle of each of the plurality of holes is a predetermined angle.

In some embodiments, the one or more directionality criteria are satisfied when the plurality of holes have a predetermined focal point.

In some embodiments, the one or more bonding criteria are satisfied when a time to bond the die to a substrate is less than a predefined time period.

In some embodiments, the one or more bonding criteria are satisfied when a yield of die bonded to substrates exceeds a predefined threshold.

In some embodiments, a count of the plurality of holes satisfies a predetermined count.

In some embodiments, the application element is circular.

In some implementations, the present disclosure relates to a method. The method includes applying hot air to a die. The method also includes placing the die on a substrate after applying the hot air to the die. The method further includes waiting a predefined bonding period in order to establish a bond between the die and the substrate.

In some embodiments, the method further includes picking up the die prior to applying the hot air to the die.

In some embodiments, the die is picked up from a wafer, the wafer includes a plurality of die.

In some embodiments, the method further includes applying an adhesive to the substrate before placing the die on the substrate.

In some embodiments, the temperature of the hot air satisfies a temperature criterion.

In some embodiments, the pressure of the hot air satisfies a pressure criterion.

In some embodiments, the velocity of the hot air satisfies a velocity criterion.

In some embodiments, a length of time that the hot air is applied to the die satisfies a predefined application period.

In some embodiments, applying the hot air to the die includes positioning the die a predetermined distance from the source of the hot air.

In some implementations, the present disclosure relates to a bonding system. The bonding system includes a heating element configured to heat air. The bonding system also includes an application element having a plurality of holes configured to apply the heated air to a die, the application element is characterized by an arrangement of the plurality of holes that satisfies one or more directionality criteria, the application element including one or more sensors for collecting feedback information associated with at least one of the temperature, pressure, and velocity of the heated air expelled through the plurality of holes of the application element. The bonding system further includes an air blower configured to expel the heated air through the plurality of holes of the application element. The bonding system further includes a controller configured to control the heating element and the air blower based on the feedback information from the one or more sensors, the controller sets at least one of the temperature, pressure, and velocity of the heated air expelled through the plurality of holes of the application element in order to satisfy one or more bonding criteria.

DETAILED DESCRIPTION OF SOME EMBODIMENTS

The headings provided herein, if any, are for convenience only and do not necessarily affect the scope or meaning of the claimed invention.

When manufacturing chips or integrated circuits (ICs), semiconductor die are often bonded to a substrate or package with an adhesive material (sometimes also herein referred to as the "die bonding process"). In some situations, low yields are observed for film applications of the die bonding process due to the lack of adherence of film adhesives. One solution to this problem is to apply heat after placing a die on the substrate. This solution, however, is unsatisfactory as it leads to quality control failures, and, in turn, decreased units-per-hour (UPH).

The present disclosure may help solve and/or mitigate the adherence problem while maintaining satisfactory UPH.

Figure 1:
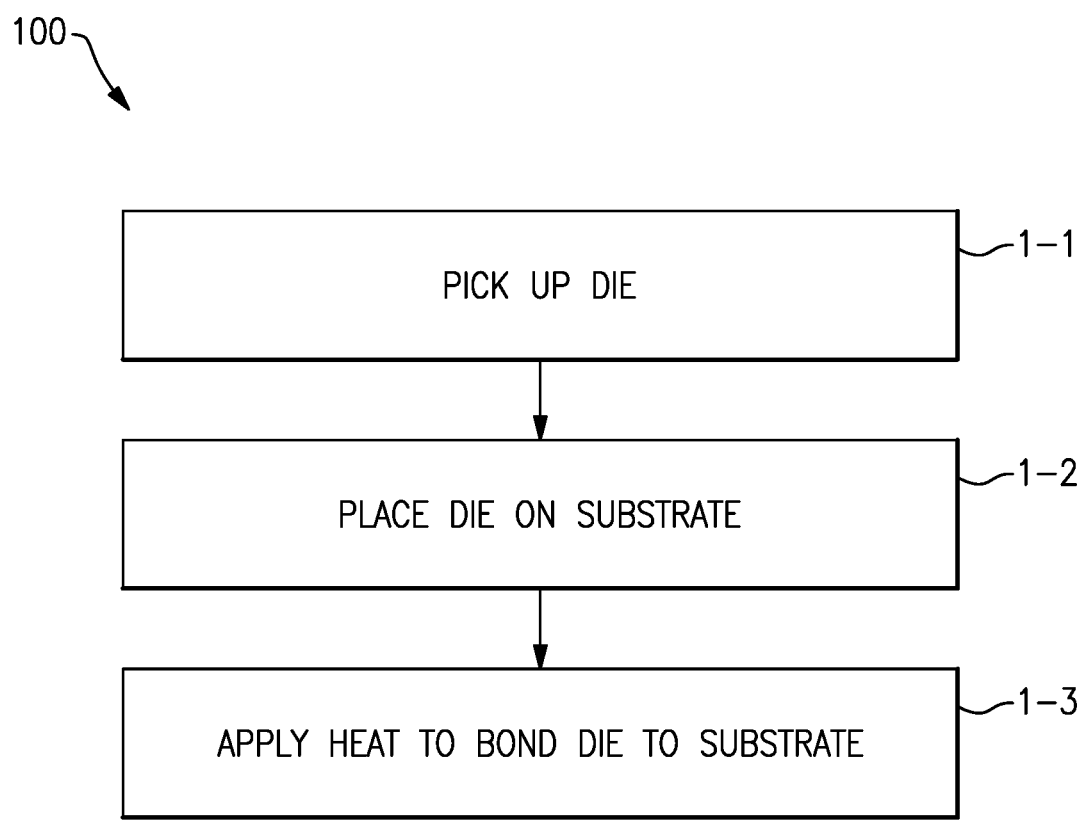
FIG. 1 is a flowchart representation of a method of die bonding, in accordance with some embodiments.

FIG. 1 is a flowchart representation of a method 100 of die bonding in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, briefly, in some circumstances, the method 100 includes: picking up a die; placing the die on a substrate; and applying heat to bond the die to the substrate.

To that end, as represented by block 1-1, the method 100 includes picking up a die. For example, a die is picked up from a wafer, which includes a plurality of die, by a pick-up tip of a manufacturing machine.

As represented by block 1-2, the method 100 includes placing the die on a substrate. For example, the substrate is associated with a chip or an IC. In some embodiments, an adhesive (e.g., an epoxy) is applied to a location on the substrate that is associated with the die prior to placing the die on the substrate.

As represented by block 1-3, the method 100 includes applying heat to bond the die to the substrate. In some embodiments, hot air (e.g., between 100° C. and 300° C.) is applied to the combination of the die and the substrate in order to cure or set the adhesive so that a proper bond is established between the die and the substrate.

Figure 2:
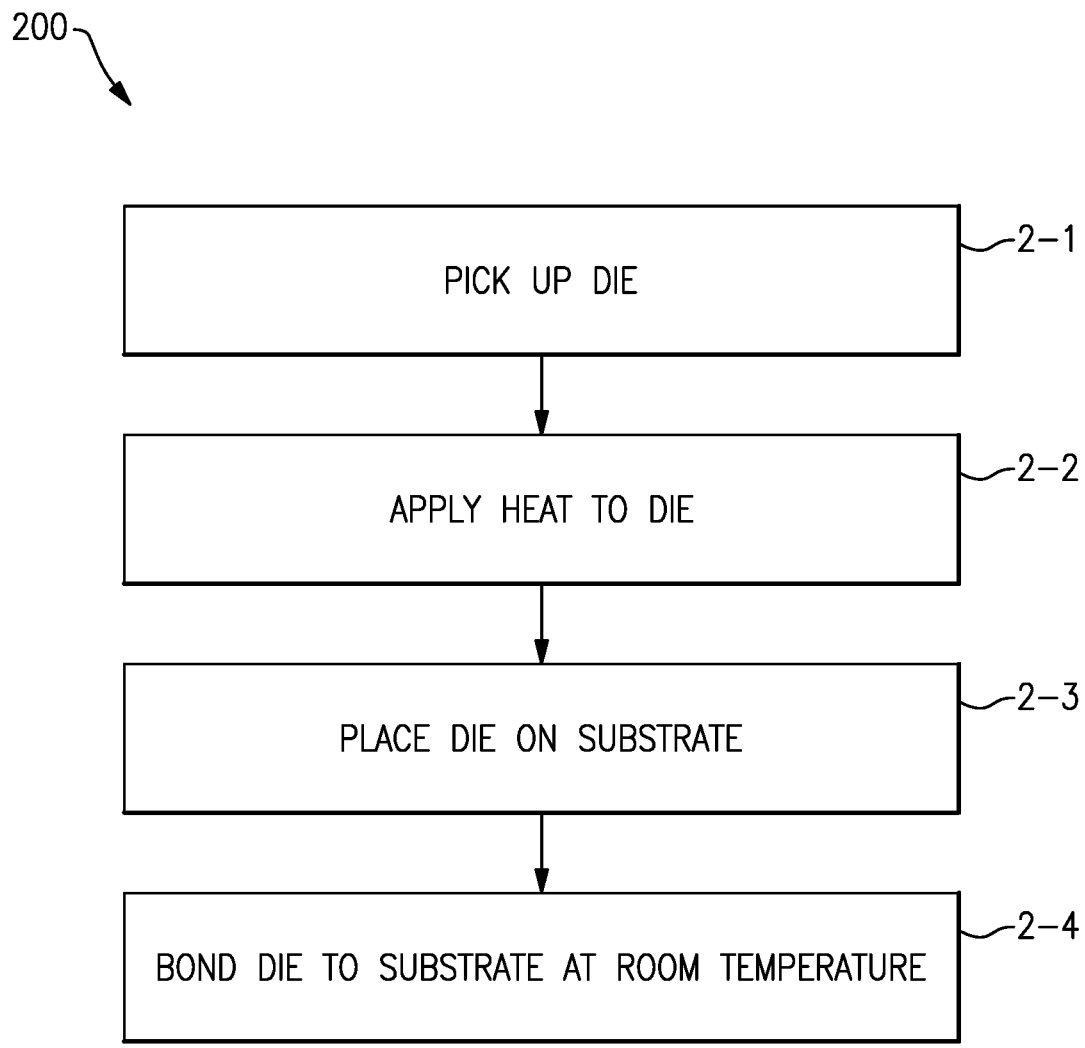
FIG. 2 is a flowchart representation of a method of die bonding, in accordance with some embodiments.

FIG. 2 is a flowchart representation of another method 200 of improved die bonding in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, briefly, in some circumstances, the method 200 includes: picking up a die; applying heat to the die; placing the die on a substrate; and bonding the die to the substrate at room temperature.

To that end, as represented by block 2-1, the method 200 includes picking up a die. For example, a die is picked up from a wafer, which includes a plurality of die, by a pick-up tip of a manufacturing machine (e.g., a robotic arm).

As represented by block 2-2, the method 200 includes applying heat to the die. In some embodiments, hot air (e.g., (e.g., between 100° C. and 300° C.) is applied to the die by an application element (e.g., the application element 306 in FIGS. 3 and 4A-4B). In some embodiments, the temperature of the hot air satisfies a temperature criterion (e.g., 110 to 120° C.). In some embodiments, the pressure of the hot air satisfies a pressure criterion (e.g., 0.1 to 0.2 mPa). In some embodiments, the velocity of the hot air satisfies a velocity criterion (e.g., 10 to 10000 $cm^3$/second). In some embodiments, the die is positioned a predetermined distance from the application element by the pick-up tip (e.g., 0.5 to 10 cm). In some embodiments, a length of time that the hot air is applied to the die satisfies a predefined application period (e.g., 0.1 to 60 seconds).

As represented by block 2-3, the method 200 includes placing the die on a substrate. For example, the substrate is associated with a chip or an IC. In some embodiments, an adhesive (e.g., an epoxy) is applied to a location on the substrate that is associated with the die prior to placing the die on the substrate.

As represented by block 2-4, the method 200 includes bonding the die to the substrate at room temperature. In some embodiments, the pre-heated die is allowed to bond with the substrate at room temperature so that a proper bond is established between the die and the substrate. In some embodiments, a bond between the die and the substrate is established by waiting a predefined bonding period (e.g., 1 minute to 24 hours) prior to further handling of the chip or IC.

Figure 3:
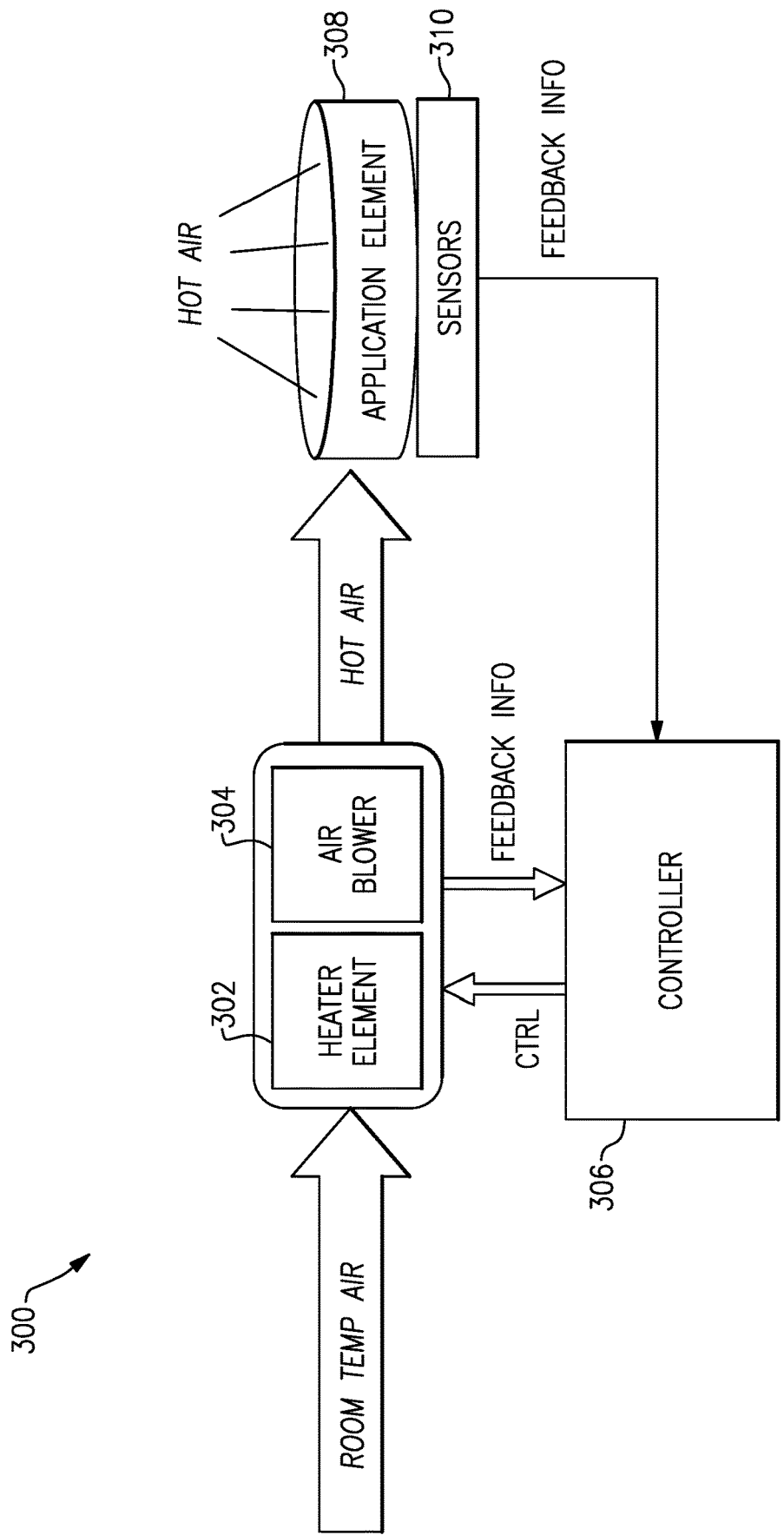
FIG. 3 is a block diagram of a bonding device, in accordance with some embodiments.

FIG. 3 is a block diagram of a bonding device 300 in accordance with some embodiments. While pertinent features are shown, those of ordinary skill in the art will appreciate from the present disclosure that various other features have not been illustrated for the sake of brevity and so as not to obscure more pertinent aspects of the example implementations disclosed herein. To that end, the bonding device 300 includes: a heater element 302, an air blower 304, a controller 306, and an application element 308 with one or more sensors 310.

In some embodiments, the heater element 302 is configured to intake air at room temperature and heat the air to a temperature set by the controller 306. In some embodiments, the air blower 304 is configured to force the air heated by the heater element 302 through a plurality of holes of the application element 308. In some embodiments, the air blower 304 forces the heated air through the plurality of holes of the application element 308 at a pressure and velocity set by the controller 306. According to some embodiments, the heater element 302 and the air blower 304 are separate components as shown in FIG. 3. In some embodiments, the functionalities of the heater element 302 and the air blower 304 are consolidated in a single component (e.g., an air handler) capable of heating and moving air.

In some embodiments, the controller 306 is configured to control the heater element 302 and the air blower 304 based on feedback information from the heater element 302 (e.g., temperature) and the air blower 304 (e.g., pressure and velocity), and the one or more sensors 310 associated with the application element 310 (e.g., temperature, pressure and velocity) in order to satisfy one or more bonding criteria. In some embodiments, the one or more bonding criteria are satisfied when a time to bond the die to a substrate is less than a predefined time period (e.g., 60 minutes). In some embodiments, wherein the one or more bonding criteria are satisfied when a yield of die bonded to substrates exceeds a predefined threshold (e.g., 99%).

In some embodiments, the controller 306 sets the heater element 302 (e.g., controls the input voltage or provides a temperature level) such that the temperature of the hot air expelled through the plurality of holes of the application element 308 (e.g., as measured by the one or more sensors 310) satisfies a temperature criterion (e.g., 110 to 120° C.). In some embodiments, the controller 306 sets the air blower 304 (e.g., controls the input voltage or provides a pressure level) such that the pressure of the hot air expelled through the plurality of holes of the application element 308 (e.g., as measured by the one or more sensors 310) satisfies a pressure criterion (e.g., 0.1 to 0.2 mPa). In some embodiments, the controller 306 sets the air blower 304 (e.g., controls the input voltage or provides a velocity magnitude) such that the velocity of the hot air expelled through the plurality of holes of the application element 308 (e.g., as measured by the one or more sensors 310) satisfies a velocity criterion (e.g., 10 to 10000 cm$^3$/second).

Figure 4A:
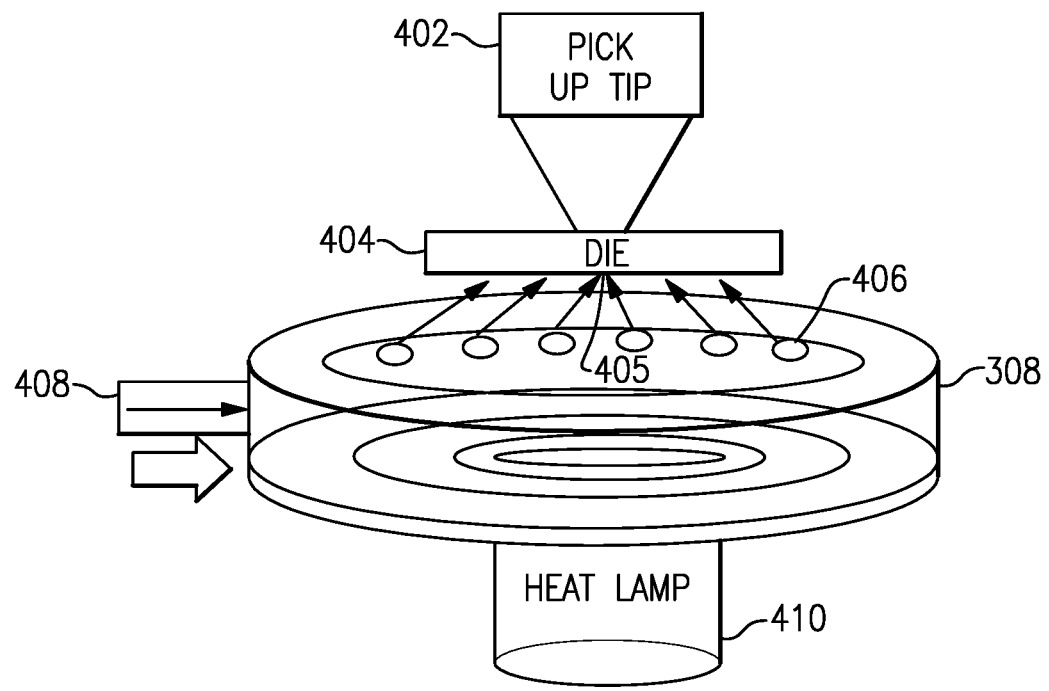
FIG. 4A is a schematic diagram of a first view the application element, in accordance with some embodiments.
Figure 4B:
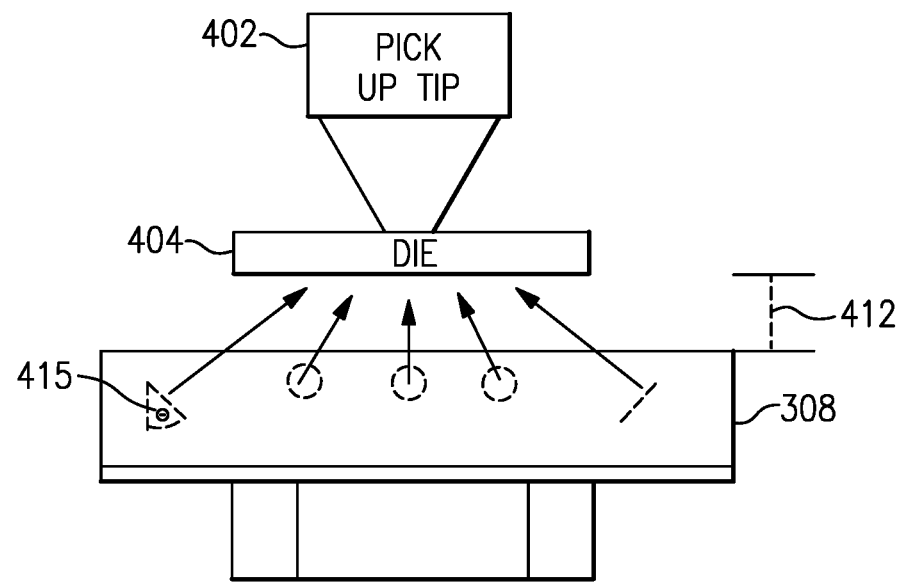
FIG. 4B is a schematic diagram of a second view the application element, in accordance with some embodiments.

In some embodiments, the application element 308 includes a plurality of holes (e.g., as shown in FIGS. 4A-4B). In some embodiments, a count of the plurality of holes satisfies a predetermined count (e.g., 16). In some embodiments, the application element 308 is a circular, annulus- or ring-shape as shown in FIGS. 3 and 4A-4B. In some embodiments, the application element 308 includes an intake coupled to the air blower 302 as shown in FIGS. 4A-4B. In some embodiments, the application element 308 also includes one or more sensors 310 (e.g., a temperature sensor, a pressure sensor, a velocity sensor, etc.). In some embodiments, the application element 308 further includes a heat lamp (e.g., a bake light) as shown in FIGS. 4A-4B.

In some embodiments, the application element 308 is characterized by an arrangement of the plurality of holes that satisfies one or more directionality criteria. In some embodiments, as will be described in more detail with respect to FIGS. 4A-4B, the one or more directionality criteria are satisfied when the angle of each of the plurality of holes is a predetermined angle (e.g., 45°). In some embodiments, as will be described in more detail with respect to FIGS. 4A-4B, the one or more directionality criteria are satisfied when the plurality of holes have a predetermined focal point.

FIG. 4A is a schematic diagram of a first view the application element 308 in accordance with some embodiments. While pertinent features are shown, those of ordinary skill in the art will appreciate from the present disclosure that various other features have not been illustrated for the sake of brevity and so as not to obscure more pertinent aspects of the example implementations disclosed herein. To that end, the application element 308 includes a plurality of holes including representative hole 406, an intake 408, and an optional heat lamp 410.

As shown in FIG. 4A, a die 404 is positioned above the application element 408 by a pick-up tip 402 of a manufacturing machine (e.g., a robotic arm). According to some embodiments, the plurality of holes of the application element 308 have a focal point 405 as shown in FIG. 4A. For example, the focal point 405 is associated with a centroid of the die 404. In some embodiments, the one or more directionality criteria are satisfied when the plurality of holes have a predetermined focal point (e.g., the focal point 405). In some embodiments, the application element 308 is a circular, annulus-shape with the plurality of holes on the inner perimeter and a heat lamp 310 in its center.

FIG. 4B is a schematic diagram of a second view the application element 308 in accordance with some embodiments. In FIG. 4B, the elements of the application element 308 are similar to and adapted from those discussed above with reference to FIG. 4A. Elements common to FIGS. 4A and 4B include common reference numbers, and only the differences between FIGS. 4A and 4B are described herein for the sake of brevity. According to some embodiments, the die 404 is positioned a distance 412 (e.g., 0.5 to 10 cm) from the application element 308. In some embodiments, each of the plurality of holes of the application element 308 have an angle 415. In some embodiments, the one or more directionality criteria are satisfied when the angle of each of the plurality of holes is a predetermined angle (e.g., the angle 415).

Figure 5:
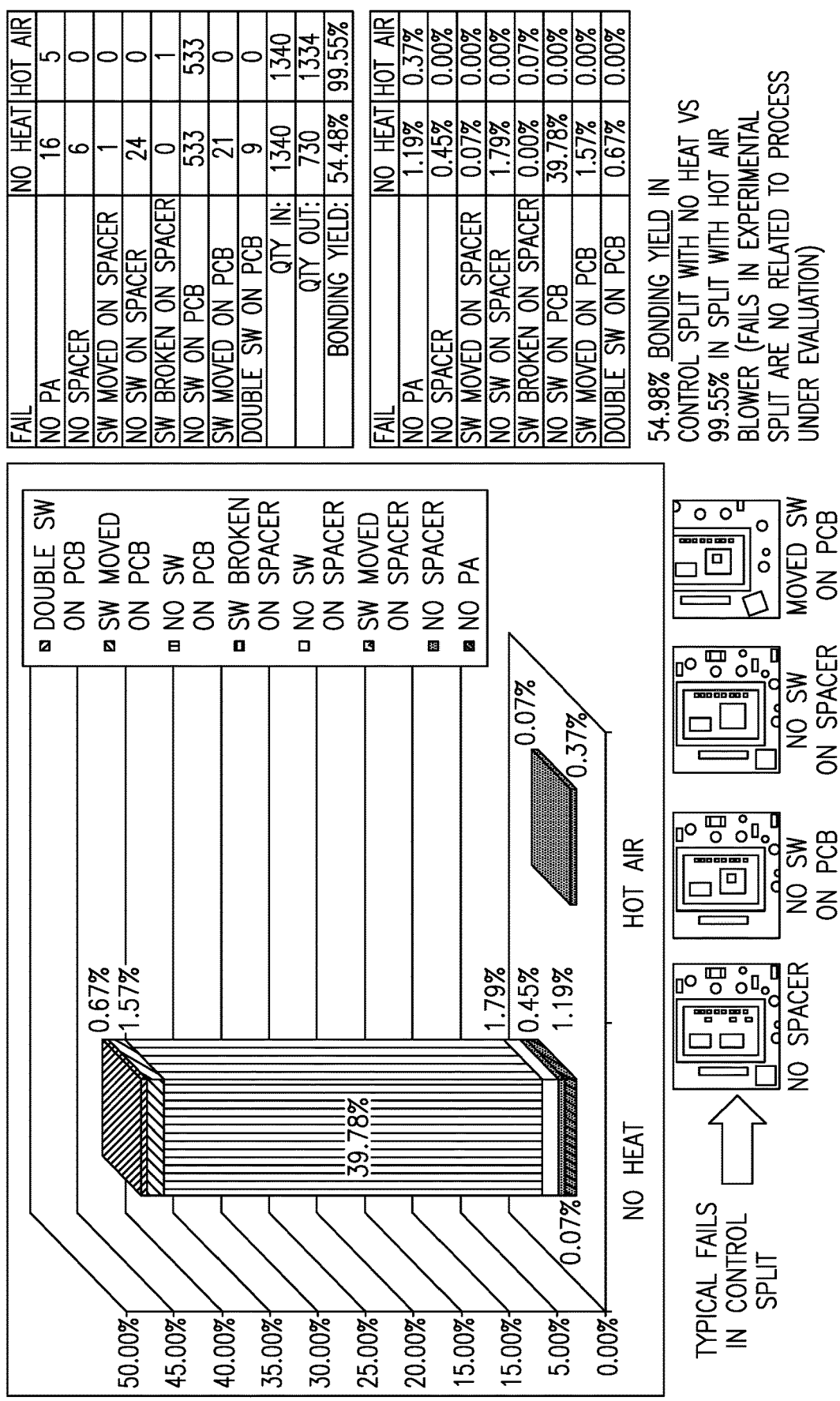
FIG. 5 shows example performance data, in accordance with some embodiments.

FIG. 5 shows example performance data for the method 200 of improved die bonding in FIG. 2 in accordance with some embodiments. According to some embodiments, the performance data shows the number and percentage of failures for 1340 chips or ICs produced according to the "hot air" die bonding process described in method 200 and a "no heat" control die bonding process. As shown in FIG. 5, performance data is broken down by the type of failures such as "no PA (power amplifier)," "no spacer, "SW (switch) moved on spacer," "SW broken on spacer," "no SW on PCB (printed circuit board)," "SW moved on PCB," and "double SW on PCB." FIG. 5 also shows illustrative examples of some of the aforementioned failure types. As shown in FIG. 5, the performance data shows the yield for the "no heat" control die bonding process (e.g., 54.48%) and for the "hot air" die bonding process (e.g., 99.55%). As such, the "hot air" die bonding process described in method 200 has a very high yield as compared to the control die bonding process the and die bonding process described in method 100.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some implementations of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method comprising:
heating air by a heating element;
applying the heated air to a die by an application element, the application element having a plurality of holes configured to apply the heated air to the die, the application element characterized by an arrangement of the plurality of holes that satisfies one or more directionality criteria;
placing the die on a substrate after applying the heated air to the die; and
waiting a predefined bonding period in order to establish a bond between the die and the substrate.

2. The method of claim 1 further comprising picking up the die prior to applying the heated air to the die.

3. The method of claim 2 wherein the die is picked up from a wafer, the wafer including a plurality of die.

4. The method of claim 1 further comprising applying an adhesive to the substrate before placing the die on the substrate.

5. The method of claim 1 wherein a temperature of the heated air satisfies a temperature criterion.

6. The method of claim 5 wherein the application element includes a temperature sensor that provides the temperature of the heated air expelled through the plurality of holes of the application element.

7. The method of claim 1 wherein a pressure of the heated air satisfies a pressure criterion.

8. The method of claim 7 wherein the application element includes a pressure sensor that provides the pressure of the heated air expelled through the plurality of holes of the application element.

9. The method of claim 1 wherein a velocity of the heated air satisfies a velocity criterion.

10. The method of claim 9 wherein the application element includes a velocity sensor that provides the velocity of the heated air expelled through the plurality of holes of the application element.

11. The method of claim 1 wherein a length of time that the heated air is applied to the die satisfies a predefined application period.

12. The method of claim 1 wherein applying the heated air to the die includes positioning the die a predetermined distance from the source of the heated air.

13. The method of claim 1 wherein an air blower expels the heated air through the plurality of holes of the application element.

14. The method of claim 1 wherein the one or more directionality criteria are satisfied when an angle of each of the plurality of holes is a predetermined angle.

15. The method of claim 1 wherein the one or more directionality criteria are satisfied when the plurality of holes has a predetermined focal point.

16. The method of claim 1 wherein a count of the plurality of holes satisfies a predetermined count.

17. The method of claim 1 wherein the application element is circular.

* * * * *